United States Patent
Britton et al.

[11] Patent Number: 5,528,170
[45] Date of Patent: Jun. 18, 1996

[54] LOW-SKEW SIGNAL ROUTING IN A PROGRAMMABLE ARRAY

[75] Inventors: Barry K. Britton, Schnecksville, Pa.;
Dwight D. Hill, San Carlos, Calif.;
William A. Oswald, Allentown, Pa.

[73] Assignee: AT&T Corp., Murray Hill, N.J.

[21] Appl. No.: 535,362

[22] Filed: Sep. 28, 1995

Related U.S. Application Data

[60] Continuation of Ser. No. 294,684, Aug. 23, 1994, abandoned, which is a division of Ser. No. 971,501, Nov. 4, 1992, Pat. No. 5,384,497.

[51] Int. Cl.$^6$ .......................... H03K 19/00; H01L 27/00
[52] U.S. Cl. .................. 326/41; 326/93; 326/39
[58] Field of Search ................... 326/39, 41, 47, 326/93, 101, 21

[56] References Cited

U.S. PATENT DOCUMENTS

| | | | |
|---|---|---|---|
| 3,987,287 | 10/1976 | Cos et al. | 235/152 |
| 4,433,331 | 2/1984 | Kollaritsch | 340/825.83 |
| 4,642,487 | 2/1987 | Carter | 307/463 |
| 4,855,619 | 8/1989 | Hsieh et al. | 307/443 |
| 4,870,302 | 9/1989 | Freeman | 307/465 |
| 5,122,685 | 6/1992 | Chan et al. | 307/465.1 |
| 5,144,166 | 9/1992 | Camarota et al. | 307/465.1 |
| 5,153,463 | 10/1992 | Keiichi | 307/465 |
| 5,172,014 | 12/1992 | El-Ayat et al. | 307/465 |
| 5,212,652 | 5/1993 | Agrawal et al. | 364/489 |
| 5,254,886 | 10/1993 | El-Ayat et al. | 326/41 |
| 5,384,497 | 1/1995 | Britton et al. | 326/44 |

FOREIGN PATENT DOCUMENTS

| | | | |
|---|---|---|---|
| 0461798 | 12/1991 | European Pat. Off. | H03K 19/177 |

OTHER PUBLICATIONS

XILINX "XC4000 Logic Cell Array Family", Product Description, Dec. 1991, pp. 1–19.

electronic Design Magazine, Oct. 1, 1992, "FPGA Advances Cut Delays, Add Flexibility; Improved FPGA Architectures and Processes Increase Gate Counts, Speed, And Open New Applications." Dave Bursky.

Dwight D. Hill, et al, A New Architecture for High–Performance FPGAs, paper handed out at the Second International workshop on "Field Programmable Logic and Applications," Vienna, Austria, Aug. 31, 1992. Pp. 1–6 and FIG. 3.

1990 IEEE International Conference On computer Design: VLSI in Computers & Processors, Sep. 17–19, 1990, IEEE New York US, pp. 391–395; D. Hill et al.: "Preliminary Description of Tabula Rasa, an Electrically Reconfigurable Hardware Entine".

(List continued on next page.)

*Primary Examiner*—David R. Hudspeth
*Assistant Examiner*—Jon Santamauro
*Attorney, Agent, or Firm*—James H. Fox

[57] ABSTRACT

Providing low-skew clock signals to a Field Programmable Gate Array (FPGA) chip normally requires devoting a certain number of bondpads to that purpose. However, that limits the number of clocks that may be applied, and may also limit which bondpads can be used for that purpose. In the present invention, any input/output bondpad may be used to supply a low-skew clock, or other global type signal, to one or more of the Programmable Function Units (PFUs). This is accomplished by using a criss-crossed grid of parallel conductor groups. Any of the conductors may be supplied by a clock from a bondpad or alternatively driven directly from a PFU, thereby allowing the distribution of internally-generated clocks. To facilitate programmable interconnects between the horizontal and vertical conductors, the outer conductor in a group crosses over the others at defined intervals, to thereby become the inner conductor. In this manner, each cell may drive a subset of the conductors in a group, thereby reducing the number of drivers needed. This allows all the buffer and conductor topologies to be identical for each cell, which significantly aids in the computer-aided design of the FPGA, as well as simplifying its programming.

8 Claims, 3 Drawing Sheets

OTHER PUBLICATIONS

Electronic Engineering, vol. 64, No. 786, Jun. 1992, London GB pp. 9–10 XP000301765, "AT&T's Orthogonal ORCA Targets the FPGA Future".

Proceedings of the IEEE 1990 Custom Integrated Circuits conference, May 13–16, 1990, IEEE New York US, pp. 31.2.1–31.2.7; H.–C. Hsieh et al. "Third–Generation Architecture Boosts Speed and Density of Field–Programmable Gate Arrays".

LOW-SKEW SIGNAL ROUTING IN A PROGRAMMABLE ARRAY

This application is a continuation of application Ser. No. 08/294,684, filed on Aug. 23, 1994, now abandoned, which is a Division Under Rule 1.60 of application Ser. No. 07/971,501 filed on Nov. 4, 1992, now U.S. Pat. No. 5,384,497.

BACKGROUND OF THE INVENTION

1. Field of the Invention

The present invention relates to programmable arrays that implement logic functions on an integrated circuit.

2. Description of the Prior Art

In Field Programmable Gate Arrays (FPGAs), routing conductors are used to connect together logic elements, typically through programmable interconnects. A logic element may also be programmable, and is referred to herein as a "programmable function unit" (PFU), which is also known in the art as a "configurable logic block" (CLB) or "configurable logic a element" (CLE); see for example, U.S. Pat. No. 4,870,302. For sequential circuits, some of these programmable function units are storage elements (i.e. registers). These storage elements are generally enabled to store new data through the use of a clock signal, with each register possibly receiving a different clock. In most cases, FPGAs are made at least partially from internal blocks that are more or less identical. The contents of a block includes both the PFUs and the clock routing noted above. This is desirable to facilitate the computer-aided design of the internal blocks themselves, and to ensure proper operation of interconnected blocks after the FPGA has been programmed.

In order to run a sequential circuit at high speed, the skew between a clock arriving at one PFU and the clock arriving at another PFU must be very small. On FPGAs, however, the delay introduced by routing a clock through a programmable interconnect causes a large skew between the time that the clock arrives at one PFU versus the time that same clock arrives at other PFUs. In a typical FPGA architecture as shown in FIG. 1, this problem is circumvented by adding dedicated clock routing conductors to the FPGA. For example, the bondpads 101 and 102 are dedicated to receiving clock signals, and supplying these signals to the dedicated clock conductors 118 and 122, respectively. The conductors 118 and 122 in turn supply column clock conductors 119, 120, 121; and 123, 124, 125, as indicated, which drive each of the PFUs. In addition, the bondpads 103 and 104 similarly provide clocks to each PFU via other dedicated clock conductors, which for simplicity of illustration are not shown. These dedicated clock routing conductors provide very low skew clocks.

However, one problem with this implementation is that large sections of these clock routing conductors tend to be wasted if only a small number of the PFUs on the FPGA are connected to a particular clock signal. These clock routing conductors also tend to be difficult to use for routing other signals if they are not needed for clock distribution. A third drawback is that the access to drive these clock routing conductors from off of the chip tends to be optimized for only a small number of input/output (I/O) bondpads. One known method of economizing on clock distribution conductors is to multiplex the clock distribution lines from the bondpads. For example, the multiplexers 128, 129 and 130 each receive a clock input from bondpads 107 and 108, via conductors 127 and 126, respectively. The multiplexers then select which clock to supply to each of the columns via the conductors 130, 131 and 132. In a typical case, the bondpads 105 and 106 also receive clock signals and supply them to inputs of the multiplexers via distribution lines, which for simplicity of illustration are not shown. In addition, the inputs to the multiplexers can be supplied with a clock signal from other bondpads or from the outputs of one of the PFUs. However, these techniques do not address the limitations noted above.

Therefore, it would be desirable to have an FPGA routing architecture that would allow for the distribution of low skew clocks, as well as other types of global signals, using the same routing resources. It would also be desirable that all, or at least a significant percentage, of I/O bondpads be approximately equivalent for the purpose of driving these global routing resources. The third need is that the global routing be flexible enough for each global signal to be able to drive anywhere from one PFU to all of the PFUs on the FPGA without wasting routing resources.

SUMMARY OF THE INVENTION

We have invented a technique of providing low-skew distribution of global type signals in an integrated circuit programmable logic array. The present technique provides for a criss-crossed grid of conductor groups. Any of the conductors may be supplied by a clock from a bondpad. At least one programmable cross-connect provides for connecting a conductor in one group to a conductor in another group. In one embodiment, the conductors are continuous across the logic array, so that they may be driven from either of two bondpads on opposite sides of the integrated circuit chip. In a presently preferred embodiment, to facilitate programmable connections between the criss-crossed conductors, the outer conductor in a group crosses over the others at defined intervals, to thereby become the inner conductor. In this manner, each group of conductors may more economically drive conductors in the other group.

DETAILED DESCRIPTION

Figure 1:
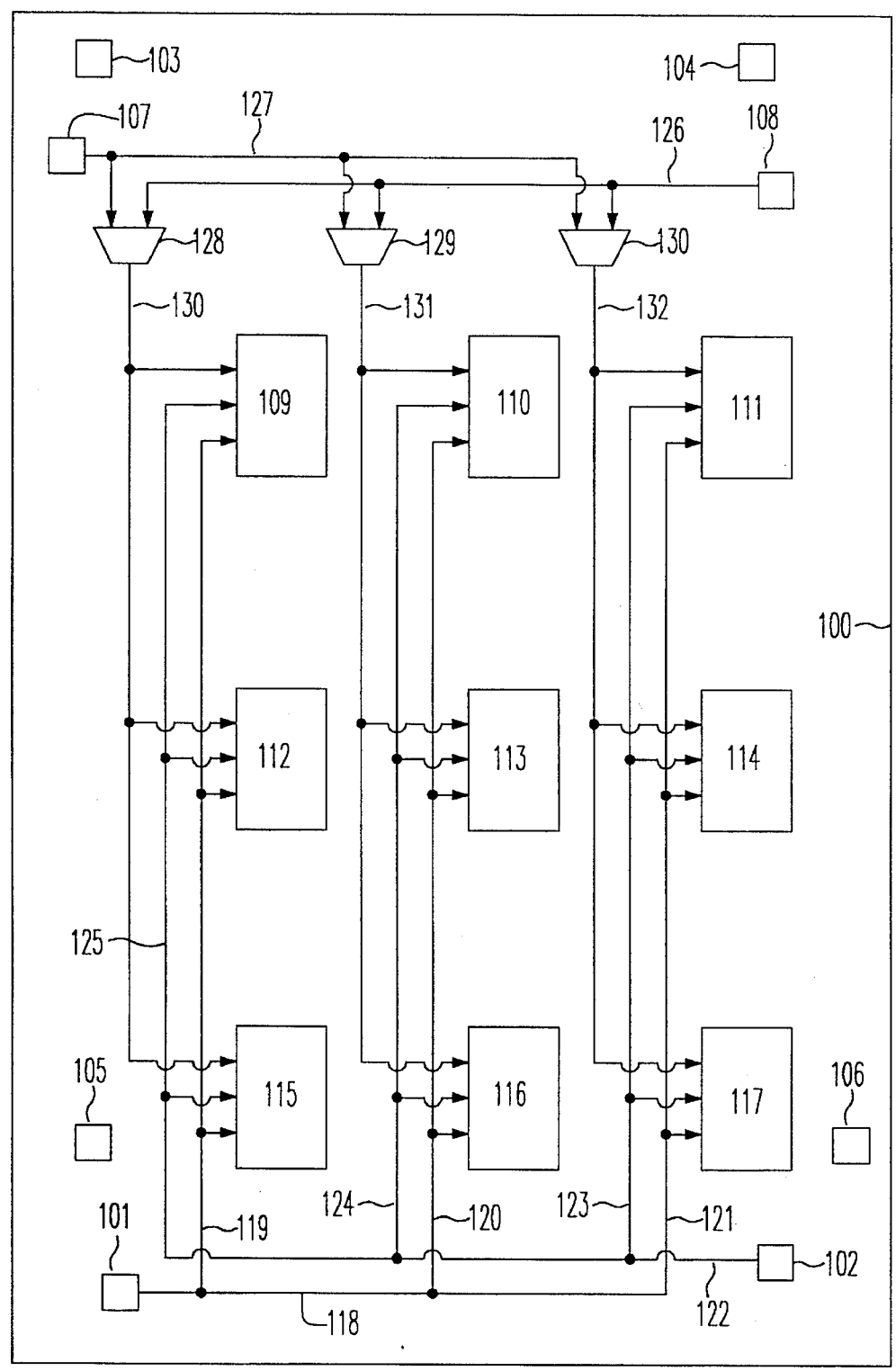
FIG. 1 shows a typical prior-art clock routing scheme.
Figure 2:
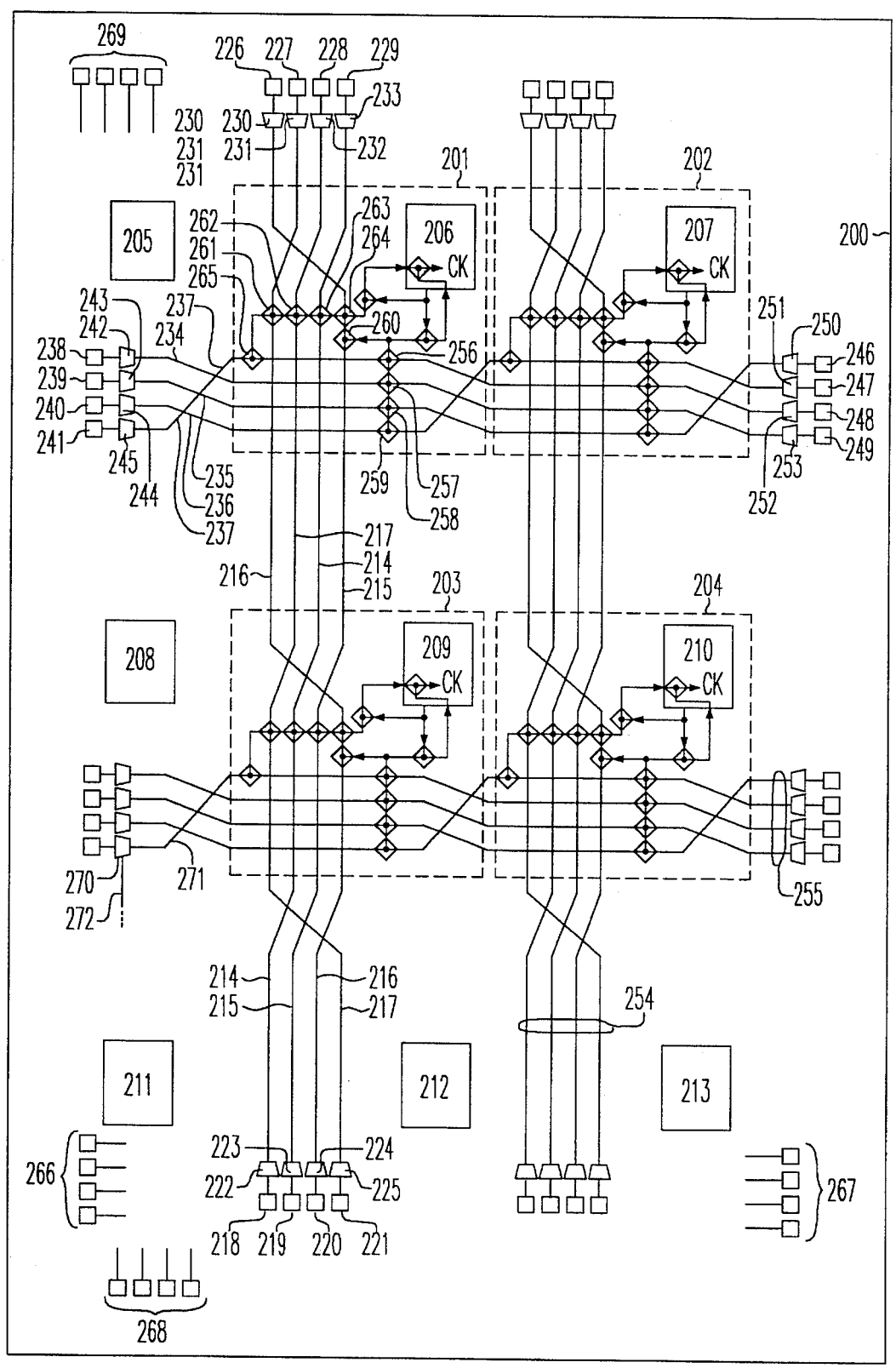
FIG. 2 shows an embodiment of the inventive technique.

The following detailed description relates to a technique wherein the problems stated above are avoided by creating a criss-crossed grid of routing conductors that may be used to distribute global signals with minimum skew in the FPGA. Referring to FIG. 2, a 3×3 array of programmable function units 205 . . . 213 provides an illustrative embodiment of the invention, with a larger size array being likely in a typical commercial application. Each global routing conductor runs in a multi-conductor "group" located between the rows and columns of the PFUs in the array. The groups are illustratively of four conductors each (e.g., 254 and 255), and lie along either one of two perpendicular axes, referred to illustratively herein as the "vertical" and "horizontal" axes. The vertical conductors are typically implemented in a first conductor level, and the horizontal conductors are typically implemented in another conductor level separated therefrom by a dielectric level. The conductors are desirably metal in most cases. As illustrated, the horizontal conductors are shorter than the vertical conductors; however, in practice it is typically desirable that the lengths be equal.

Two groups of vertical global routing conductors and two groups of horizontal routing conductors are illustrated. These conductors, along with the associated PFUs 206, 207, 209 and 210, form "programmable logic cells" (PLCs) 201, 202, 203 and 204, respectively. Other global routing conductors may be similarly provided for PFUs 205, 208 and 211, which for clarity of illustration are not shown. Furthermore, the FPGA typically also includes other (non-global) routing conductors according to techniques known in the art, also not shown. The various programmable connections between the global routing conductors and non-global (i.e. "local") conductors are also not shown. However, either type of conductor can typically drive the other by means of the appropriate programming. The PFUs usually send and receive most signals via the local conductors, with the global conductors typically being reserved for clock signals. It is possible for a global conductor to send a global signal to all the PFUs in the array. However, a signal may still be considered "global" even if it does not go to all of the PFUs. A signal is considered global as used herein if it goes to at least 20 percent of the PFUs, and more typically at least 50 percent of the PFUs in the array.

In the present technique, a given global routing conductor is connected to a programmable input buffer on at least one end. For example, the programmable input buffers 242 . . . 245 each drive the horizontal conductors 234 . . . 237, respectively. Therefore, a clock signal applied to the bondpads 238 . . . 241 may be driven onto these conductors. Similarly, the clock signal may be applied to the bondpads 246 . . . 249 on the opposite edge of the integrated circuit chip 200, so that the conductors may be driven through the programmable input buffers 250 . . . 253. As shown, the conductors 234 . . . 237 are continuous across the chip from one set of input buffers to the other. However, in an alternate embodiment of the invention, the conductors extend across only a portion of the chip. For example, they may be discontinuous between cells 201 and 202. In that case, they are each driven by only one of the input buffers shown. However, they are typically continuous across at least two of the cells of the FPGA. It can be seen that the vertical routing conductors (e.g., 214 . . . 217) are similarly connected to programmable input buffers (222 . . . 225 and 230 . . . 233), which connect to bondpads (218 . . . 221 and 226 . . . 229). The vertical conductors may also extend continuously across the chip between the buffers as shown, allowing them to be driven from either end of the chip. Alternatively, the vertical conductors may be discontinuous, as between cells 201 and 203, for example. This arrangement gives the designer great flexibility in providing clock signals to the conductors, as compared to prior-art techniques.

In the present technique, programmable cross-connects are provided so that a global routing conductor in one axis may be used to provide a global signal to a routing conductor in the perpendicular axis. For example, a routing conductor in the horizontal axis may be used to drive one or more routing conductors in the vertical axis. The one or more vertical routing conductor may then be used to distribute the clock signal to a column of PFUs. Any one of the horizontal routing conductors in a given group may provide the clock signal from the bondpad. To accomplish this connection, the programmable connector 256, 257, 258 or 259 that is associated with the horizontal conductor supplying the clock signal is programmed to connect to the input of cross-connect driver 260. Similarly, a given vertical routing conductor may be used to drive one or more of the horizontal routing conductors, which may distribute the clock signal to a row of PFUs. Alternatively, a PFU output may be driven onto one or more of the horizontal and/or vertical conductors, thus allowing internally-generated clocks (or other global signals) to be distributed in the same manner.

Since programmable connections are relatively costly for FPGAs, especially since each connection to global conductors typically requires a buffer, it is costly to supply programmable connections to/from all vertical routing conductors from/to all horizontal routing conductors. Therefore, it is advantageous in many cases to provide these connections for only a subset of all possible combinations between the horizontal and vertical routing conductors. In the embodiment of FIG. 2, only the conductor nearest the PFU in a given cell is driven from a conductor in the other axis. For example, in cell 201, only horizontal line 237 is driven from the vertical group (through cross-connect driver 265), whereas only the vertical line 215 is driven from the horizontal group (through cross-connect driver 260). However, it is still possible to supply the clock signal to any of the PFUs while avoiding undesirable skew, and still allowing for identical cells. This is accomplished by twisting each of the group of routing conductors in each axis inside of each cell. This allows those routing conductors that cannot be connected to the output of a buffer inside a given cell to eventually be rotated to where this routing conductor can be driven inside another internal cell.

For example, as shown in FIG. 2, the conductor 214 is on the left at the bottom of the array as viewed. However, the conductor 217 crosses over the other three conductors in the cell immediately below cell 203. Therefore, 217 becomes the outer conductor (i.e., furthest from PFU 209) in cell 203, and 216 becomes the inner conductor. The conductor 216 then crosses over the other three conductors within cell 203, so that it becomes the outer conductor, and 215 becomes the inner conductor in cell 201. A similar twist is provided for the horizontal conductors. The twist is typically implemented by forming conductor vias that allow the conductor to cross over the other conductors on a different conductor level, being separated therefrom by a dielectric. Thus, although only a subset of the clock routing conductors may be cross-connected in a given cell, all routing conductors can be driven by one or more cells inside the entire FPGA. (This assumes that the number of rows and/or columns in the array, with one twist per cell, is at least equal to the number of the conductors (N) in each group.) However, the present invention may be practiced without twists by simply increasing the number of cross-connects that connect the horizontal and vertical groups. Then, more than one conductor in a given cell may be driven from the conductors in the other axis.

Figure 3:
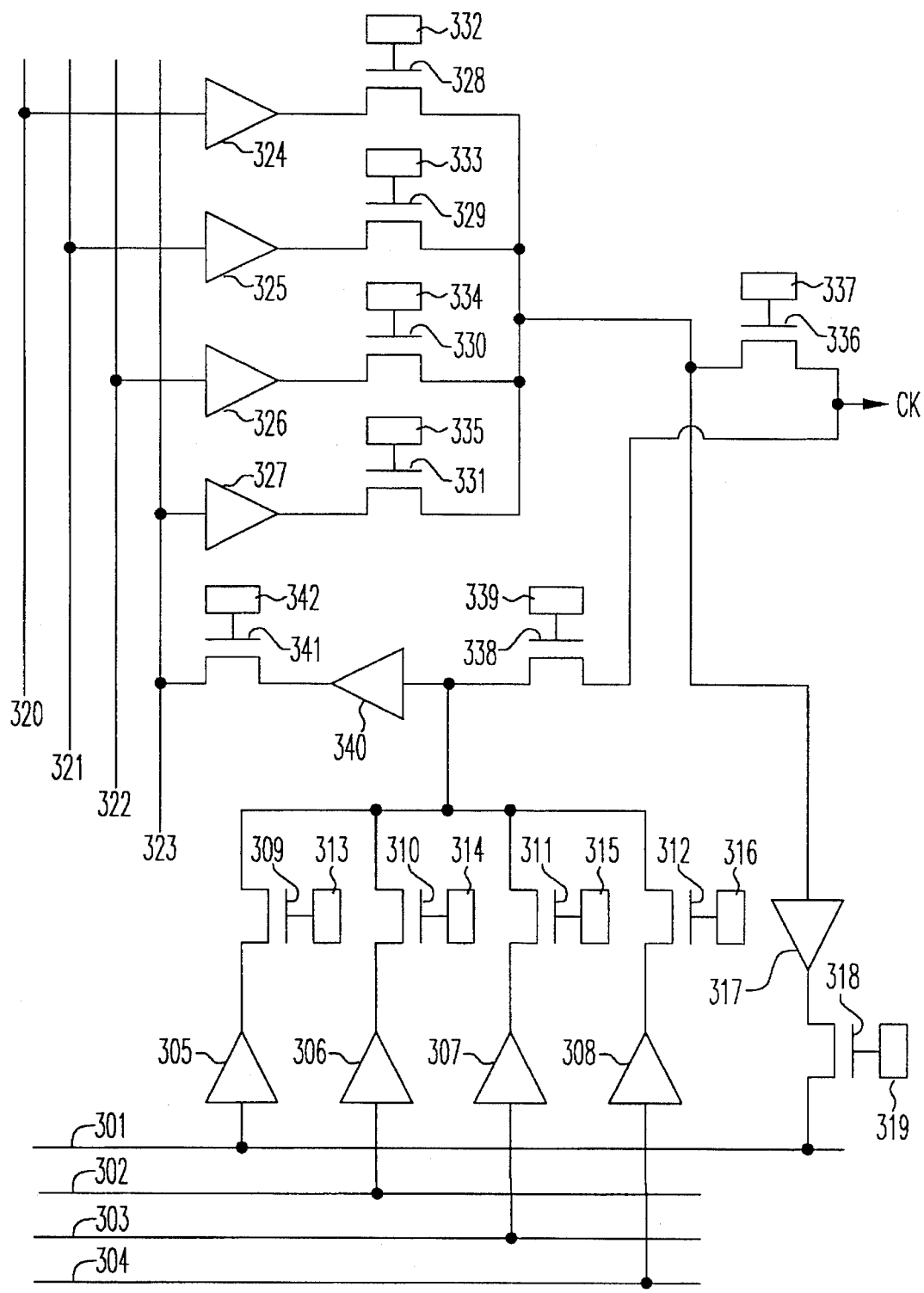
FIG. 3 shows a typical circuit embodiment of programmable cross-connects used with the inventive technique.

One embodiment of the programmable cross-connect used in the above technique is illustrated in FIG. 3. The horizontal conductors 301 . . . 304 are connected to the inputs of buffers 305 . . . 308, which drive pass transistors 309 . . . 312, respectively. The pass transistors form transmission gates that are controlled by programmable means 313 . . . 316, which place either a high or low logic level on the gates of the pass transistors, thereby allowing a signal to pass or be blocked, respectively. The programmable means 313 . . . 316 are typically static registers that are software-controlled by signals supplied to the FPGA chip by an external source, according to techniques known in the art. The programmable means may alternatively comprises a ROM (read only memory), EEPROM (electrically erasable, programmable ROM), static random access memory, or other storage device. The outputs of the pass transistors are connected to the input of driver 340, which provides a high drive capability so as to drive the vertical conductor 323 at high speed with minimum delay, to minimize clock skew. Driver 340 is connected to conductor 323 by pass transistor 341, which is controlled by programmable means 342. In a similar manner, the vertical conductors 320 . . . 323 may provide a clock signal onto the horizontal conductor 301 by means of buffers 324 . . . 327, pass transistors 328 . . . 331, programmable means 332 . . . 335, driver 317, pass transistor 318, and programmable means 319.

Note that in FIG. 3 the conductors in a given axis are continuous through the programmable connectors; only the cross-connects from one axis to another include buffers and transmission gates. Hence, the clock skew introduced by the programmable cross-connects is minimized. Also included in FIG. 3 are pass transistor 338 and programmable means 339. These allow the signal from any of the horizontal conductors 301 . . . 304 that are selected by the programmable means 313 . . . 316 to be supplied directly to the clock (CK) input of the PFU in the same cell as the programmable cross-connect circuitry. Similarly, the pass transistor 336 and programmable means 337 allow the signal from any of the vertical conductors 320 . . . 323 to be supplied to the CK input; see also FIG. 2 in this regard.

The present technique allows for distributing global signals from a bondpad to the PFUs with various degrees of skew, depending on the needs of the circuit. To minimize the skew, a single global conductor in a given (e.g., vertical) axis that carries the global signal drives multiple global conductors located in the other (e.g., horizontal) axis. Then, the individual PFUs are driven from the global conductors in the horizontal axis. Furthermore, the lowest skew is typically obtained if the single global conductor in the vertical axis is centrally located. This vertical global conductor may be driven directly from a bondpad. However, even lower skew is possible if the vertical conductor is in turn driven at its mid-point through a programmable cross-connect from a horizontal conductor that is driven from the bondpad. That results in the most symmetrical signal distribution, and hence lowest skew, but with a slight increase in signal latency. Alternatively, the skew is in practice still relatively low even when the single vertical conductor is located along an edge of the array, and driven directly from a bondpad. It is alternatively possible to use only a single global conductor, which distributes the global signal to local conductors, which in turn deliver the signal to the individual PFUs. However, the local conductors introduce additional delay, since they are not continuous conductors, but include pass transistors used as transmission gates. Hence, the skew is typically somewhat higher than in the previously-described cases.

It can be seen that with the present invention, the connections between the horizontal and vertical routing conductors in each axis are configurable, whereby only the needed routing conductors will be occupied with a given signal. This allows the unused clock routing conductors to remain free to route other signals. Also, the buffer that is provided in the cross-connect between the vertical and horizontal routing conductors supplies a fast, non-degraded clock signal to the PFUs. In the above embodiment, any of the global routing conductors in one axis can be used to drive the global routing conductors in the other axis with approximately the same effectiveness. Therefore, any global routing conductor can be used as a clock source. If every user I/O pad on the device has the same connectivity to at least one of these global routing conductors, then every I/O pad can be used as a clock pin. Thus the need for dedicated clock pins for an FPGA is alleviated. Although clock signals are typical of the types of signals that can be routed with the present invention, other types of global signals may also benefit from the use of the present technique. These signals include, for example, register resets, clock enables, tri-state enables, and memory write signals, with still others being possible.

In a presently-preferred embodiment, all of the signal (non-power supply) bondpads of the FPGA chip are connected to programmable input buffers (e.g., 222 . . . 225, etc.). This allows for great flexibility in supplying the global signals to the FPGA. In addition, these bondpads typically also supply other types of signals that may be selected when the global-type input signals are de-selected. For example, referring to FIG. 2, the input buffer 270 may be programmed to drive the global line 271. Alternatively, the input buffer 270 may be programmed to drive the local line 272. In that case, the global line may be de-selected, or alternatively may remain connected if desired. It is also possible to drive the global line from a PFU when the input buffer is not programmed to drive the global line from a bondpad.

Alternatively, it is possible to implement the invention without connecting all of the signal bondpads to the global input buffers, whereby some of the bondpads do not supply global signals. For example, bondpads 266 . . . 269 may be dedicated to non-global uses. However, to maximize the benefits of the inventive technique, we recommend that at least half of the signal bondpads on the FPGA chip be connected to the programmable global input buffers. Note that at least some of the bondpads also supply output signals from the integrated circuit, which function may be combined with supplying input signals using I/O buffers known in the art. Still other variations of the present technique are possible.

We claim:

1. An integrated circuit comprising an array of programmable logic cells and bondpads for supplying input signals; wherein each cell comprises global routing conductors and a programmable logic element; with a first group of global routing conductors lying parallel to a first axis of the array, and a second group of global routing conductors lying parallel to a second axis; wherein at least the conductors of said first group are continuous across said array and each connected to a bondpad through a programmable input buffer;

and further comprising at least one programmable cross connect for programmably connecting a given global clock conductor of said first group and a given global clock conductor of said second group;

and still further comprising a programmable connection for programmably connecting said given global clock conductor of said first group to a clock input of at least one of said programmable logic elements;

and still further comprising a programmable connection for programmably connecting said given global clock conductor of said second group to a clock input of at least one of said programmable logic elements.

2. The integrated circuit of claim 1 wherein at least some of said global routing conductors are each connected at both ends to bondpads through programmable input buffers located on opposite sides of said integrated circuit.

3. The integrated circuit of claim 1 wherein all of said global routing conductors are each connected at both ends to bondpads through programmable input buffers located on opposite sides of said integrated circuit.

4. The integrated circuit of claim 1 wherein at least some of said global routing conductors are each connected at only one end to a bondpad through a programmable input buffer.

5. The integrated circuit of claim 1 wherein all of the signal bondpads on said integrated circuit are connected to programmable input buffers that programmably connect to said global routing conductors.

6. The integrated circuit of claim 1 wherein at least half of the signal bondpads on said integrated circuit are connected to programmable input buffers that programmably connect to said global routing conductors.

7. The integrated circuit of claim 1 wherein said given global clock conductor of said first group and said given global clock conductor of said second group are programmably connected to clock inputs of the same programmable logic element.

8. The integrated circuit of claim 1 wherein the conductors of said second group are also continuous across said array.

* * * * *